United States Patent
Ioffe et al.

[11] Patent Number: 6,037,650
[45] Date of Patent: Mar. 14, 2000

[54] VARIABLE CAPACITANCE SEMICONDUCTOR DEVICE

[76] Inventors: Valery Moiseevich Ioffe, Novogodnyaya, d. 16, kv-16, 630064, Novosibirsk, uL.; Askhat Ibragimovich Maksutov, 501 etMagnitki, d. 62, kv. 9, Magnitogorsk, uL., both of Russian Federation

[21] Appl. No.: 09/043,759

[22] PCT Filed: Dec. 2, 1996

[86] PCT No.: PCT/RU96/00334

§ 371 Date: Mar. 26, 1998

§ 102(e) Date: Mar. 26, 1998

[87] PCT Pub. No.: WO97/23001

PCT Pub. Date: Jun. 26, 1997

[51] Int. Cl.[7] .................................................. H01L 29/93
[52] U.S. Cl. ........................ 257/596; 257/598; 257/664
[58] Field of Search .................................. 257/595, 596, 257/597, 601, 602, 664; 333/246, 247

[56] References Cited

FOREIGN PATENT DOCUMENTS

| 0452035A1 | 10/1991 | European Pat. Off. . |
| 367488 | 3/1973 | U.S.S.R. . |
| WO A1 95/31010 | 11/1995 | WIPO . |

OTHER PUBLICATIONS

International Search Report for PCT/RU96/00344, Mar. 26, 1997.

*Primary Examiner*—John Guay
*Attorney, Agent, or Firm*—Nexsen Pruet Jacobs & Pollard, LLP

[57] ABSTRACT

The semiconductor device comprises a low-conductivity or insulating layer (5) on one surface of which is formed a conducting section (6) while the other face is provided with a hole- or electron-type semiconductor layer (1) with an ohmic contact. A semiconductor or metal layer (2) is provided on the surface of the semiconductor layer and with (1) forms a p-n junction or Schottky barrier with another ohmic contact. The choice of the alloy cross section and thickness of the layer (1) is restricted by the condition that said layer or part of it must be fully depleted by the basic charge carriers until breakdown of the p-n junction and/or the Schottky barrier when the latter is subjected to an external bias determined by the inequality shown in the application. The p-n junction and/or Schottky barrier can be formed with a non-homogeneous dopant section along a selected X direction on the surface of the layer (1). Along another direction Z on the surface of the semiconductor layer (1) are formed conducting strips (3) which with (1) form a non-rectifying contact and are either connected to the ohmic contact with (1) or at a distance from said ohmic contact. The strips (3) are either connected to the conducting sections (4) on the free surface of the layer (5), or the layer (5) is formed across the top of the strips.

23 Claims, 6 Drawing Sheets

VARIABLE CAPACITANCE SEMICONDUCTOR DEVICE

TECHNICAL FIELD

The present invention relates to semiconductor devices. The proposed device can appear as a voltage-controlled variable capacitor, varicap, or transistor. Built around the device may be parametric amplifiers and voltage-controlled transmission lines.

BACKGROUND ART

As to its principle of operation the proposed semiconductor device is closest to varicaps (varactors), i.e., semiconductor devices with voltage-controlled reactance. It is common knowledge (cf. a textbook "Physics of semiconductor devices" by S. Zea, V.1, Moscow Mir Publishers, 1984, pp.80–91, 260–262, 381, 384 (in Russian) that in all the three basic elements of semiconductor electronics (that is, p-n junction, Schottky barrier, and MIS-structure) a semiconductor layer is liable to be formed at a definite polarity of the charge applied, said layer being depleted in majority charge carriers and serving as an analog of a dielectric interlayer in conventional capacitors. The thickness of the depletion layer depends on the bias voltage, whereby the differential capacitance C of a semiconductor device may be controlled by the voltage V.

A typical varactor construction appears as a plane-parallel heavily doped semiconductor layer having one conduction type and established in a weakly-doped working area having another conduction type. Both of the plates are provided with ohmic contacts for the control voltage to apply thereto. By varying the distribution of a dopant in the varactor operating area one can provide various C/U relationships. All and every of varicaps are disadvantageous in that the range of voltage values used is limited to the breakdown voltage of the depletion layer. Thus, the ratio between the maximum and minimum capacitance values is restricted too the breakdown voltage in an overwhelming majority of constructions of the now existing varactors.

A variable capacitor of the heretofore-known construction is now in widespread use (cf., e.g., A reference guide to high-frequency circuitry, by E.Red, Moscow Mir Publishers, 1990, pp.219–220 (in Russian), which appears as a mechanical device adapted to displace the capacitor plates with respect to each other. An obvious disadvantage of the device resides in sluggishness of mechanical functioning.

Microwave-frequency microelectronics make use most frequently of a stripline which is in fact a twin line, comprising two conductor strips between which an insulator or semi-insulator layer is placed (cf., e.g., "Electronics". An Encyclopaedic Dictionary, Moscow, Sovetskaya Entsiklopedia Publishers, 1991, pp.253, 254, 491; Modern Gallium-Arsenide Based Devices by M.Shur, Moscow Mir Publishers, 1991, p.405 (in Russian).

A disadvantage inherent in all transmission lines mentioned before resides in that such line parameters as characteristic impedance and length cannot be controlled by an external voltage source which impedes microminiaturization, adjustment and frequency retuning of numerous micrcowave-frequency microelectronic devices.

A transistor is commonly understood to mean a semiconductor device having three or more leads for applying the control voltage thereto and adapted for amplifying, generating, and converting electric oscillations (cf. Encyclopaedic Dictionary, Moscow, Sovetskaya Entsiklopedia Publishers, 1991, p.557). A substantial disadvantage inherent in the now-existing transistors, both field-effect and bipolar junction ones, consists in that their output power is inversely proportional to the squared frequency thereof, which results from a limitation imposed by the avalanche-breakdown voltage of a rather narrow space-charge region of the p-n junction and by ultimate carrier velocity (cf. S. Zea, op. cit., pp.178–179).

DISCLOSURE OF THE INVENTION

The present invention has for its primary object to provide a unique semiconductor device adapted to control, in response to a change in the control voltage, the value of the capacitance of a capacitor established between the conductor plates, an insulation (dielectric) or a low-conductivity (semiconductor) layer being formed therebetween, as well as to control the resistance value of the low-conductivity layer.

The foregoing object is accomplished due t,o the fact that a semiconductor device, comprising a low-conductivity or an insulator layer on one of its surfaces a conductor area is established, while on the other surface thereof a semiconductor layer 1 is formed, having either an electron- or a hole-type conduction and provided with an ohmic contact, said layer 1 carrying a layer 2 which is made of a metal and/or a semiconductor having the type of conduction opposite to that of the layer 1, said layer 2 forming a p-n junction and/or a Schottky barrier together with the layer 1 and having another ohmic contact; the dopant profile and the thickness of the layer 1 should meet the condition of a complete depletion of the layer 1 or part thereof in the majority charge carriers till the breakdown of the p-n junction or of the Schottky barrier upon applying thereto an external bias voltage determined by the following inequality:

$$(q/\varepsilon_S) \cdot \int_0^{d(x,z)} Ni(x, y, z) y \, dy - Uk < Ui,$$

where Ui—the breakdown voltage of the semiconductor layer 1;
y—the coordinate counted off the metallurgical boundary of the p-n junction or Schottky barrier along the thickness of the layer 1;
q—an elementary charge;
d(x,z)—the thickness of the layer 1;
N1(x,y,z)—dopant profile in the layer 1;
z, x—the coordinates on the surface of the layer 1;
$\varepsilon_s$—permittivity of the layer 1;
Uk—built-in junction potential.

In addition, the semiconductor device may be characterized in that the p-n junction and/or the Schottky barrier is formed with a modulated dopant profile along the direction X preselected on the surface of the layer 1, and conductor strips 3 are formed on the surface of the semiconductor layer 1 along the other direction Z, said strips forming an ohmic contact with the layer 1, or are connected to the ohmic contact of the layer 1, or are arranged in a spaced relation to the ohmic contact, or are connected to conductor strips 4 provided on a free surface of a layer 5, which may be established over the strips 3. In addition, the semiconductor device may be characterized in that a dielectric (high-ohmic semiconductor) layer is formed over the free surface thereof.

Hence the essence of the present invention resides in that a possibility is provided for changing the capacitance or conductance effective between the ohmic contact with the semiconductor 1 and a conductor strip 6 established on the insulator or low-conductivity layer 5 to which a high-rating supply voltage source is connected by means of a low supply voltage applied to the p-n junction.

BRIEF DESCRIPTION OF THE DRAWINGS

In what follows the present invention is exemplified by the disclosure of some specific embodiments thereof to be had in conjunction with the accompanying drawings, wherein:

To illustrate the operation of the proposed device reference is made to FIG. 1 presenting one of the embodiments thereof, comprising an n-type region 1 modulation-doped along the direction X and having an ohmic contact, a region 2 having an ohmic contact and establishing a p-n junction or a Schottky barrier together with the region 1, conductor strips 3 connected immediately to strips 4, a dielectric interlayer 5, and a conductor strip 6. FIG. 1 illustrates also a control voltage source 7 connected to the p-n junction, an input signal source 8.

Figure 1:
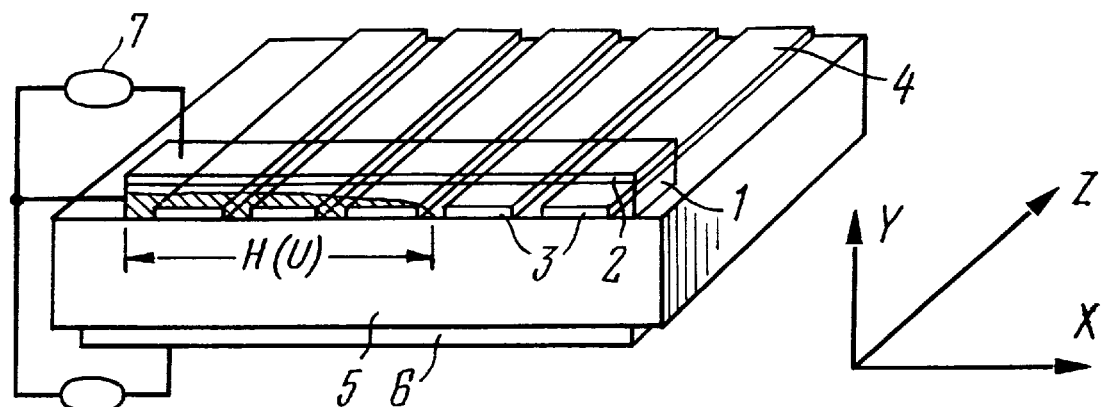
FIG. 1 presents one of the embodiments of the herein-proposed semiconductor device provided with a source of control voltage and a source of input signal.

Established over the conductor strips 3 is the p-n type layer 1 which forms, together with the conductor strips 3, a nonrectifying (ohmic contact) and is modulation-doped along the direction X in such a manner that the degree of doping decreases as the value of X increases. Established over the layer 1 is the region 2 having an ohmic contact and forming a p-n junction or a Schottky barrier together with the region 1. As the blocking voltage U (of the source 7) at said junction increases, the size of the neutrality region (H(U)) in the p-n type semiconductor along the direction X decreases continuously. In addition, an effective width W of the capacitor plates having an increment equal to the width of the strip 3, equals the value of H(U), which results in a proportional reduction of the capacitance between the strip 6 and the ohmic contact with the region 1 (C~H(U)).

In the aforediscussed case the conductor strips are established on one of the surfaces of the dielectric plate. It is obvious that when conductor strips are also established on the other dielectric surface and a modulation-doped (across the strips) p-n junction or a Schottky barrier is formed over said conductor strips, an effective area of the capacitor plates may also be varied by applying a voltage to said junction or said barrier.

It is noteworthy that the capacitance-control voltage relationship depends on the shape of the region whereon the conductor strips 4 and on the dopant profile of the p-n junction or Schottky barrier.

Figures 2, 3:
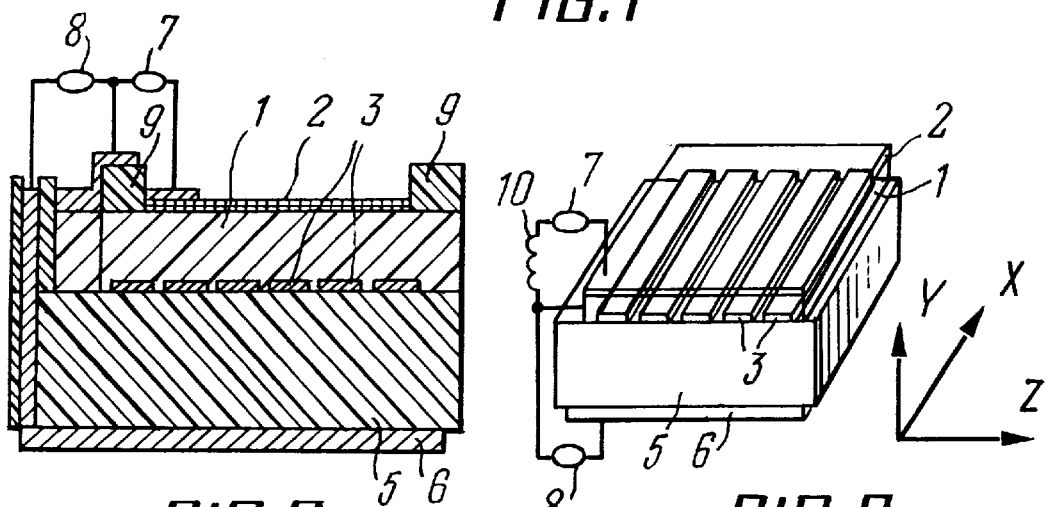
FIG. 2 presents the proposed semiconductor device made according to the planar-fabrication technology.
FIG. 3 presents the proposed semiconductor device appearing as a variable characteristic impedance transmission line provided with a source of control voltage and a source of input signal.

When manufacturing semiconductor devices using the planar-epitaxial technology, all contacts are as a rule formed on the same surface of a semiconductor wafer and are isolated from one another with a dielectric interlayer of silicon dioxide. FIG. 2 shows a voltage-controlled variable capacitor manufactured according to the planar-epitaxial technology and comprising conductor strips 3 (4), a conductor strip 6, a dielectric interlayer 5, a region 1 having an ohmic contact and modulation-doped with the n-type dopants across the width of the device, a region 2 having an ohmic contact and establishing, together with the region 1, a p-n junction. FIG. 2 illustrates also a control voltage source 7 connected to the p-n junction, and an input signal source 8. The strips 3 are made from an Au-Sb alloy in order to establish an ohmic contact with the n-type semiconductor. Used as the dielectric is silicon dioxide. An ohmic contact with the p-region 2, as well as that with the n-region 1 (heavily doped in the area of the contact), and a strip 6 are made of aluminium. All of the contacts are isolated from one another with a silicon-dioxide protective layer 9.

To prevent an undesirable effect of the capacitive coupling between the regions 2 and 6, the p-n junction (or Schottky barrier) may be established over an inconsiderable part of the strips 3 or be brought out beyond them and connected to the extensions of the strips 3 outside the dielectric interlayer 5.

Another way to rule out an undesirable effect of the capacitive coupling between the regions 2 and 6 consists in that both the n- and p-regions of the p-n junction are modulation-doped along the direction X. As the control voltage rises the size of the neutrality region along the direction X decreases both in the p- and n-regions. If the capacitance of the device need be changed in wide ranges, so whenever the size of the contact pad to the region 1 is commensurable with that of the device itself, the contact pad may be brought to the preformed dielectric interlayer (FIG. 2).

If the capacitance of the device effective between the ohmic contact of the region 1 and the region 6 need not be changed in wide ranges, the conductor strips 3 provided on the surface of the region 1 are connected immediately to the ohmic contact to the region 1. Such being the case, an effective area of the plates of a voltage-controlled capacitor is changed by the value equal to the area of gaps between the strips 3.

To illustrate the operation of the proposed device as a controlled transmission line, reference is made to FIG. 3 presenting one of the embodiments of the proposed transmission line, comprising conductor strips 3 arranged lengthwise said line, a conductor strip 6, a dielectric interlayer 5, an n-type region 1 modulation-doped with the n-type dopants across the line width and having an ohmic contact, and a region 2 having an ohmic contact and establishing a p-n junction or a Schottky barrier together with the region 1. and a region 2 having an ohmic contact and establishing a p-n junction or a Schottky barrier together with the region 1. FIG. 3 illustrates also a control voltage source 7 connected to the p-n junction through a choke coil 10 serving for alternating-current decoupling of the circuits of the input signal source and of the control voltage source, and an input signal source 8.

Established over the conductor strips 3 is the p-n type layer 1 which forms, together with the conductor strips 4, an ohmic contact and is modulation-doped across the line width (i.e., along the direction Z) in such a manner that the degree of doping decreases as the value of Z increases. Established over the layer 1 is the region 2 having an ohmic contact and forming a p-n junction or a Schottky barrier together with the region 1. As the blocking voltage U (of the source 7) at said junction increases, the size of the neutrality region (H(U) in the p-n type semiconductor along the direction X decreases continuously. As a result, an effective width W of the transmission line having an increment equal to the width of one of the strips 3, equals the value of H(U), which results in a proportional increase of the transmission line characteristic impedance (*~1/H(U).

Figure 4:
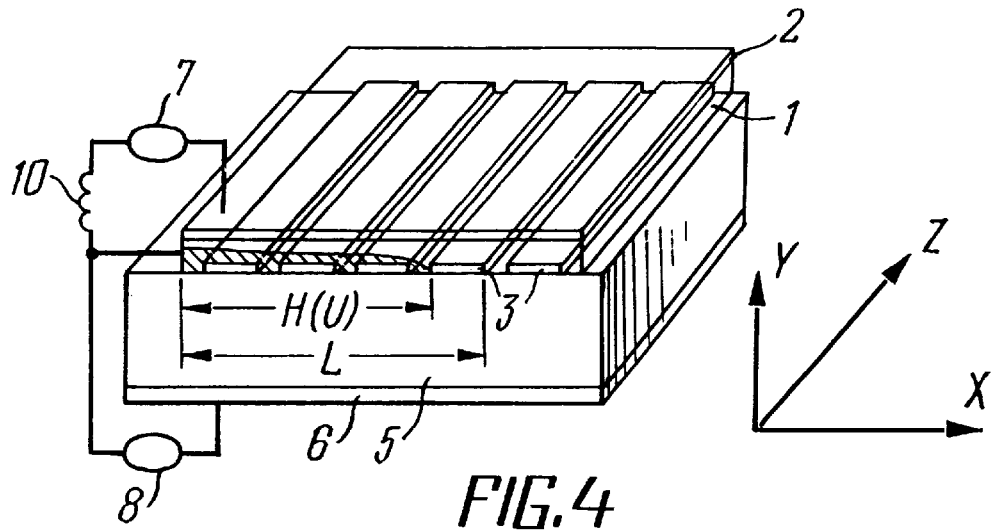
FIG. 4 presents the proposed semiconductor device appearing as a variable-length transmission line provided with a source of control voltage and a source of input signal.

To illustrate the operation of the proposed device as a variable-length transmission line, reference is made to FIG. 4. The line under consideration comprises conductor strips 4 arranged across the line width, a conductor strip 6, a dielectric interlayer 5, a region 1 modulation-doped with the n-type dopants lengthwise the line and having an ohmic contact, and a region 2 having an ohmic contact and establishing a p-n junction or a Schottky barrier together with the region 1. FIG. 4 illustrates also a control voltage source 7 connected to the p-n junction through a choke coil 10 serving for alternating-current decoupling of the circuits of the input signal source and of the control voltage source, and an input signal source 8. Established over the conductor strips 3 is the p-n type layer 1 which forms, together with the conductor strips 4, an ohmic contact and is modulation-doped lengthwise the line (i.e., along the direction X) in such a manner that the degree of doping decreases as the value of X increases. Formed over the layer 1 is the region 2 having an ohmic contact and establishes, together with the region 1, a p-n junction or a Schottky barrier. as the blocking voltage U (of the source 7) at said junction increases, the size of the neutrality region H(U) in the p-n type semiconductor along the direction X decreases, and an effective length L of the line follows H(U) with an increment equal to the width of one of the strips 3.

It is evident that when the upper strip of a conventional transmission line has perforations arranged lengthwise the line, and the perforations in the lower strip are arranged across the line, p-n junctions (Schottky barriers) are established on the surfaces of said perforated strips, featuring a dopant profile modulated either across the width of the upper strip or lengthwise the lower strip, the parameters of the transmission line (i.e., characteristic impedance and length) being determined by the values of the bias voltage externally applied to the p-n junctions (Schottky barriers).

Figure 5:
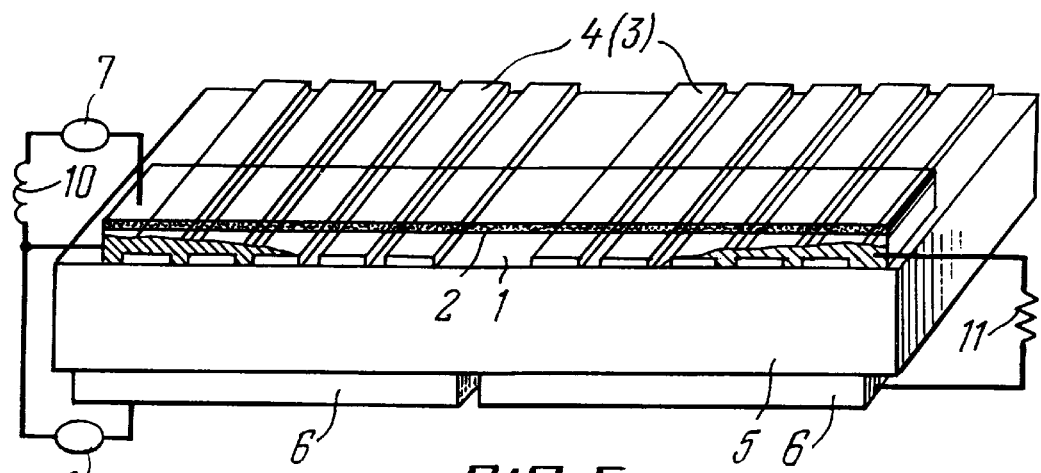
FIG. 5 presents the proposed semiconductor device appearing as a variable characteristic impedance transmission line provided with a p-n junction (Schottky barrier) is provided at the input and output thereof.

To prevent an undesirable effect of the capacitive coupling between the regions 2 and 6, the p-n junction (Schottky barrier) may be established over part of the strips 3. FIG. 5 illustrates one of the embodiments of the proposed transmission line which comprises conductor strips 4(3) arranged lengthwise said transmission line, a conductor strip 6, a dielectric interlayer 5, a region 1 modulation-doped with the n-type dopants across the line width and having an ohmic contact, and a region 2 having an ohmic contact and establishing a p-n junction or a Schottky barrier together with the region 1. FIG. 5 illustrates also a control voltage source 7 connected to the p-n junction through a choke coil 10 serving for alternating-current decoupling of the circuits of the input signal source and of the control voltage source, an input signal source 8, and a loading resistor 11 connected to the line output. The p-n junction (Schottky barrier) is provided both at start and end of the transmission line.

It is noteworthy that the p-n junction and/or the Schottky barrier may be established on an extension of the conductor strips 4 outside the dielectric interlayer 5.

Another way to rule out an undesirable effect of the capacitive coupling between the regions 6 and 2 consists in that both the n- and p-regions of the p-n junction are modulation-doped along the direction X(Z). As the control voltage rises the size of the neutrality region along the direction X decreases both in the p- and n-regions.

It is also worth noting that the p-n junction may be formed between a uniformly doped layer 1 and a layer 2 modulation-doped along the X(Z) direction. For the sake of clarity and definiteness in the examples that have been and will be considered, the layer 1 features the electron conduction. It; is obvious that the layer 1 may also have the hole conduction, whereas the layer 2 should be made of the electron-type semiconductor and/or a metal that forms, together with the layer 1 a p-n junction and/or a Schottky barrier; furthermore, the interlayer 5 may be made of a dielectric or a semiconductor with which the strip 6 forms a p-n junction and/or a Schottky barrier, or else of a semi-insulator semiconductor. It is likewise evident that the layer may have a thickness both uniform and nonuniform as to the area, and the dopant profile and the thickness of the layer 1 should meet the condition of a complete depletion of the layer 1 or part thereof in the majority charge carriers till the breakdown of the p-n junction or of the Schottky barrier upon applying an external bias voltage determined by the following inequality:

$$(q/\varepsilon_S) \cdot \int_0^{d(x,z)} Ni(x, y, z) y\, dy - Uk < Ui,$$

where Ui—the breakdown voltage of the semiconductor layer 1;

y—the coordinate counted off the metallurgical boundary of the p-n junction or Schottky barrier along the thickness of the layer 1;

q—an elementary charge;

N1 (x,y,z)—dopant profile in the layer 1;

z, x—the coordinates on the surface of the layer 1;

$\epsilon_s$—permittivity of the layer 1;

Uk—built-in potential.

In addition, the layer 2 may be doped both uniformly and nonuniformly along the directions X and Z, where X and Z state for two different directions in the plane of the surface of the layer 1, the curvilinear ones inclusive. It is also obvious that a barrier on the surface of the layer 1 may be composite, that is, a p-n junction appearing as a heterojunction is established on one part of the surface of the layer 1, whereas a Schottky barrier is formed on another part of the same surface.

The proposed semiconductor device may also be used as an electronic switch, when each of the strips 3 (4) is connected, though an individual load, to the input signal source which is connected to the ohmic contact with the layer 1. As the blocking voltage U (of the control voltage source 7) at the p-n junction (Schottky barrier) increases, the size of the neutrality region along the direction intersecting the strips 3 (4) in the semiconductor layer 1 decreases incessantly, whereby the number of loads connected to the input signal source (the permanent one inclusive) through the neutrality region of the semiconductor layer 1 and the strips 3 (4) decreases, too.

Figure 6:
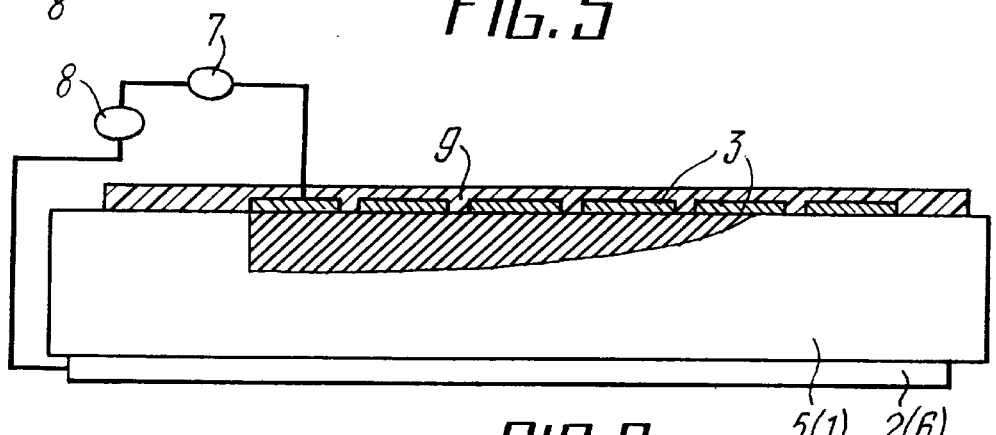
FIG. 6 presents the proposed semiconductor device appearing as a variable characteristic impedance transmission line having a Schottky barrier established between a lower strip and a semi-insulator (weakly-doped) substrate, a second (perforated) strip being established on the opposite side of said substrate to form an ohmic contact with a modulation-doped substrate.

The semiconductor layer 1 may be used as a low-conductivity material 5, while the layer 2, as a conducting wafer 6. FIG. 6 illustrates such a semiconductor device appearing as a transmission line with variable characteristic impedance, wherein the Schottky barrier is established between the bottom strip 2 (6) and the semi-insulator (weakly doped) substrate 1 (5), a second (perforated) strip being established on the opposite side of said substrate to form an ohmic contact with the modulation-doped substrate. FIG. 6 illustrates also series-connected a control voltage source 7 and an input signal source 8, as well as a protective dielectric layer 9 formed over conductor strips 3.

Figure 7:
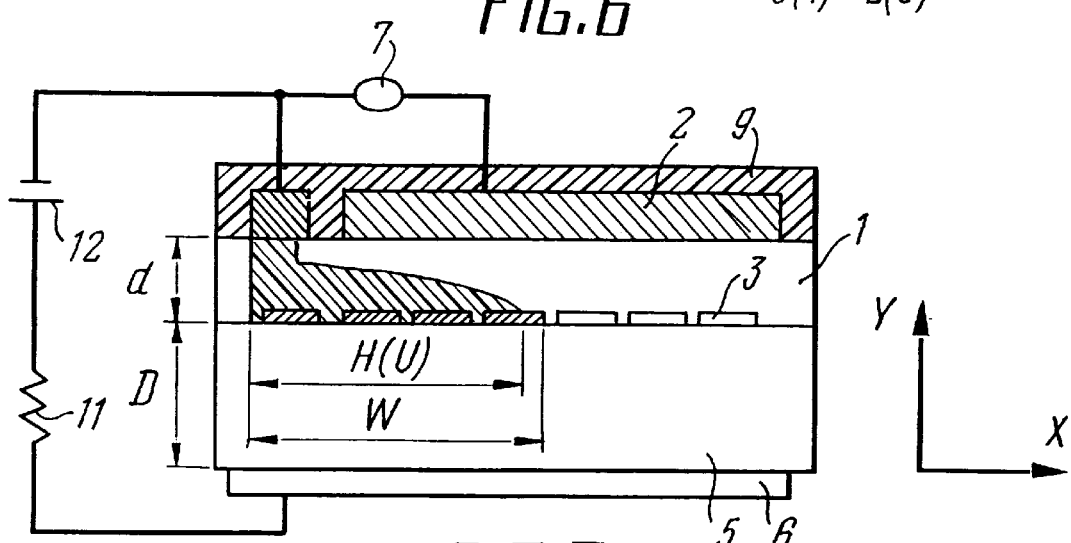
FIG. 7 presents the construction of a transistor.

When the proposed semiconductor device functions as a transistor, the layer 5 should be conductive, that is, said layer should be made either of a small-thickness dielectric through which tunnel current is free to pass, or of a conductive material, semiconductor inclusive, having the same conduction type as the layer 1. In this case the conductance of the conductive material should be low enough not to bypass the p-n junction (Schottky barrier) region of the layer 1. The operation of the proposed device is illustrated in FIG. 7 presenting a transistor which comprises a n-type region 1 having an ohmic contact and being modulation-doped along the direction X, a region 2 having an ohmic contact and establishing a p-n junction or a Schottky barrier together with the region 1, conductor strips 3 (which are at the same time strips 4), a low-conductivity layer 5 made of a weakly doped n-type semiconductor, and a conductor strip 6. FIG. 7 illustrates also a control voltage source 7 connected to the p-n junction, and a d.c. voltage source 12. Established over the conductor strips 3 is the p-n type layer 1 which forms, together with the conductor strips 3, an ohmic contact and is modulation-doped along the direction X in such a manner that the degree of doping decreases as the value of X increases. Established over the layer 1 is the region 2 having an ohmic contact and forming a p-n junction or a Schottky barrier together with the region 1. As the blocking voltage U (of the source 7) at said junction increases, the size of the neutrality region H(U) in the p-n type semiconductor along the direction X decreases continuously. As a result, an effective width W of the contact between the regions 5 and 1 follows H(U) with an increment equal to the width of one of the strips 3. Thereby the output resistance of the transistor inversely proportional to the effective area of the ohmic contact, is changed.

It should be noted that dependence of the resistance of the device (i.e., that effective between the ohmic contact with the region 1 and the region 6) on the value of the control voltage is determined by a preselected shape of the region, wherein the conductor strips 3 are provided, and by the dopant profile of the p-n junction (Schottky barrier).

In this particular case the conductor strips are established on one of the surfaces of the low-conductivity wafer 5. It is evident that when such conductor strips are formed on the other surface of the low-conductivity material, and a modulation-doped p-n junction is established over said strips across them, an effective contact area may also be varied by applying a voltage to said junction.

If the resistance of the device need be changed in wide ranges, so whenever the size of the contact pad to the region 1 is commensurable with that of the device itself, the contact pad may be brought to the preformed dielectric interlayer. If the resistance of the device effective between the ohmic contact of the region 1 and the region 6 need not be changed in wide ranges, the conductor strips 3 provided on the surface of the region 1 are connected immediately to the ohmic contact with the region 1. Such being the case, an effective area of the contacts of a voltage-controlled resistor is changed by the value equal to the area of gaps between the strips 3.

Figure 8:
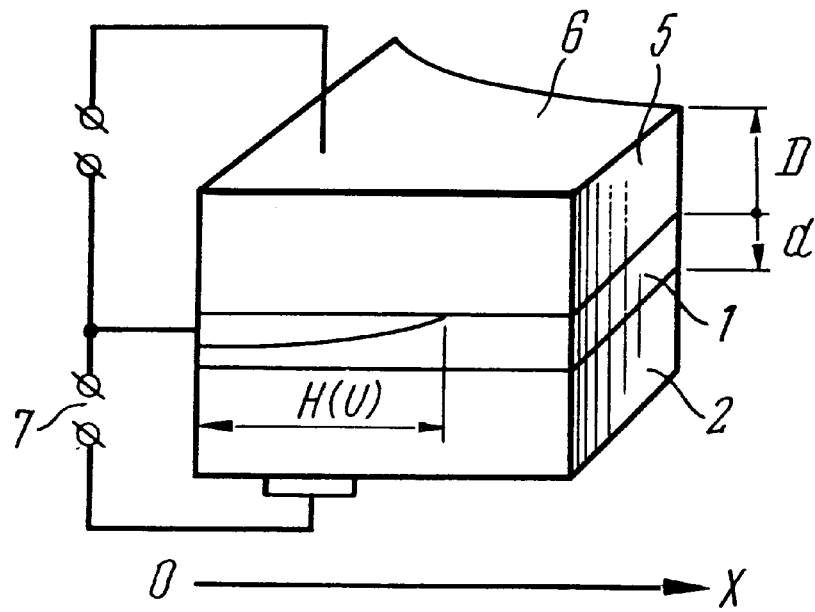
FIG. 8 presents a voltage-controlled variable capacitor.

To illustrate the operation of the proposed device as a voltage-controlled capacitor, reference is made to FIG. 8. The capacitor comprises a p-n junction (Schottky barrier) modulation-doped along the direction X. A dielectric layer 5 is formed on the surface of the p-n junction (Schottky barrier), and a conductor layer 6 is applied to the surface of said dielectric layer 5. The p-n junction comprises a heavily doped region 2 of the p+ type with an ohmic contact, a n-type film with another ohmic contact being established on said region. A nonuniform dopant profile of the donor impurity Ni(x,y) is established in the above film ($0 \leq x \leq$ Xmax, $0 \leq Z \leq F$ (x), $y \leq D$), the degree of doping rising from Xmax to 0. As the blocking voltage at said junction increases, the space-charge region gradually fills the entire n-type film, with the result that the size of the neutrality region H(U) and an effective area of the plates of the voltage-controlled capacitor formed between the neutrality region of said film and the metal layer 6 decrease incessantly. With C(t) denoting controllable capacitance of said capacitor vs time, and Q indicating the charge on said capacitor, the voltage across the controlled capacitor is as follows: U2=Q/C(t).

Figure 9:
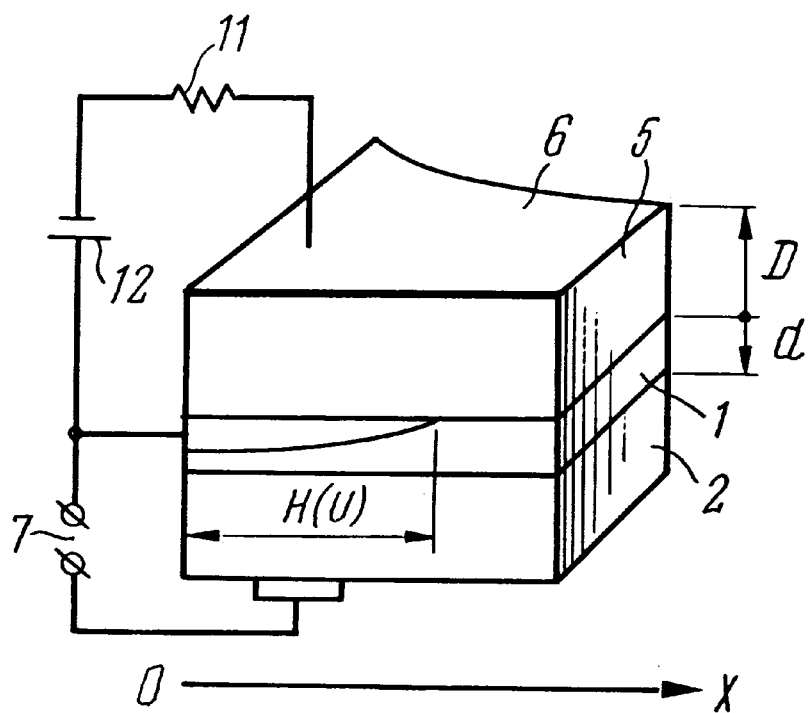
FIG. 9 presents an amplifier built around a voltage-controlled variable capacitor.
Figure 10:
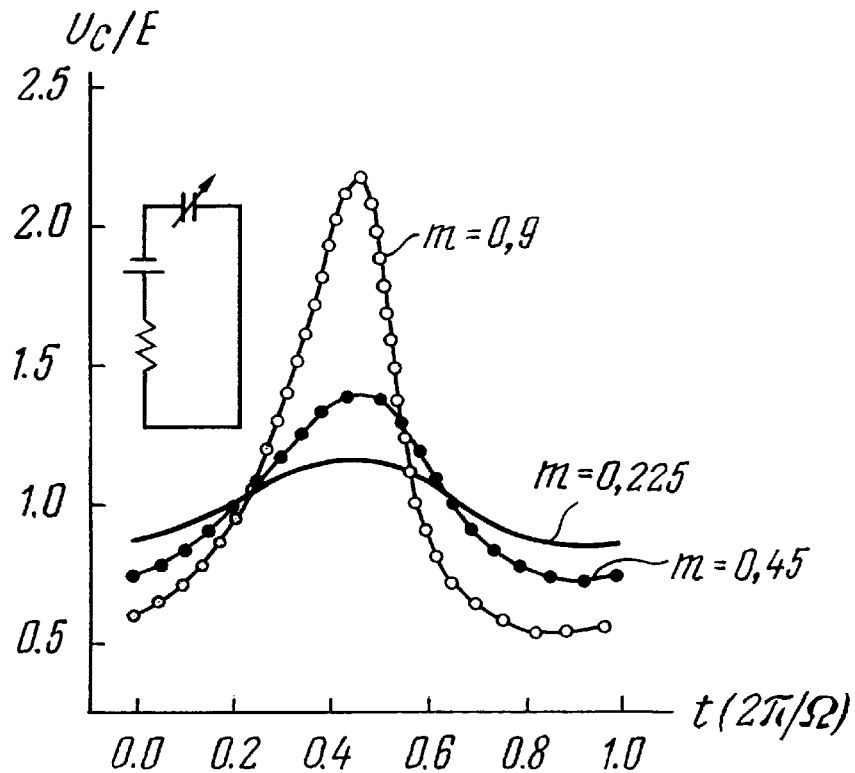
FIG. 10 is a graphic representation of a relationship between a design-basis variable-capacitor output signal and time at various degrees of modulation of the capacitance.

FIG. 9 illustrates the operation of the proposed device as a parametric amplifier with a d.c. supply voltage, wherein a possibility is provided for changing the capacitance effective between the ohmic contact with the n-type film and a conductor area 6, to both of which a high-rating supply voltage source is connected through a load with the aid of a relatively low supply voltage applied to the p-n junction. The device comprises a p-n junction modulation-do)ed along the coordinate X. Established on the surface of an n-type region 1 of said junction is a dielectric layer 5 over which a conductor layer 6 is formed. The layer 6 is connected to the p-n region 1 of said junction through a load and a d.c. supply voltage source 12.Connected to the p-n junction is a voltage source 7 having a voltage U=Uo+Um Sin ($\Omega$t), where Uo and Um are constants. The design-basis time dependence of the voltage across the controlled capacitor with the various degrees of the capacitance modulation is presented in FIG. 10. It is evident that the layer 5 may be made of a semiconductor with which the conductor area 6 forms a Schottky barrier or a p-n junction.

Figure 11:
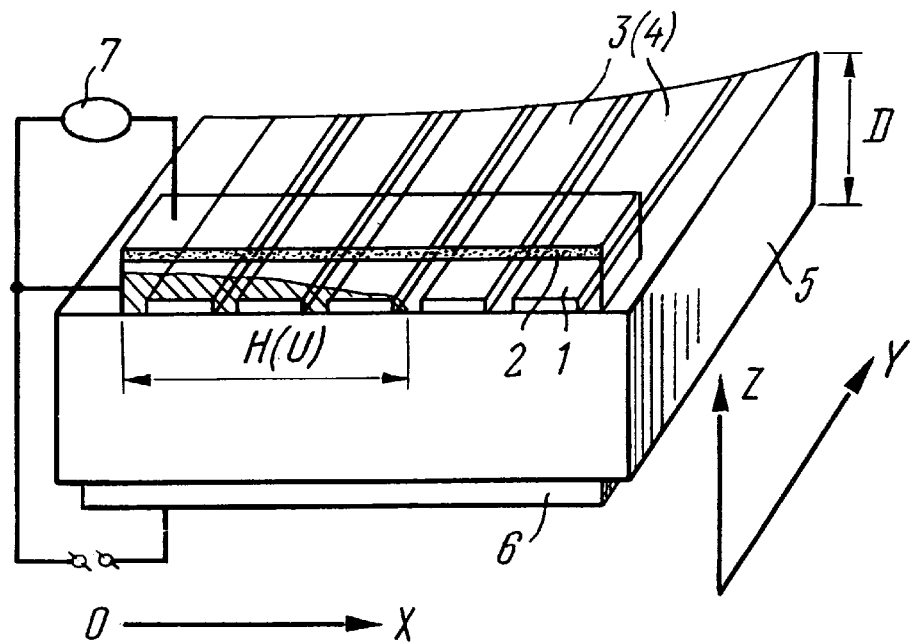
FIG. 11 presents the construction of a voltage-controlled variable capacitor.

FIG. 11 illustrates a voltage-controlled capacitor, comprising a p-n junction (Schottky barrier) modulation-doped along the direction X. The p-n junction formed over conductor strips 3 comprises a heavily doped region 2 of the p+ type with an ohmic contact, a n-type film with another ohmic contact being established on said region. The conductor strips 3 are formed on the working portion ($0 \leq x \leq Xmax$, $0 \leq z \leq F(x)$) of the dielectric surface, while on its other surface a metal layer 6 (FIG. 11) is established. A nonuniform dopant profile of the donor impurity Ni(x,y) is established in the above film, using the ion-implantation technique, the implantation dose rising from Xmax to 0. As the blocking voltage at said junction increases, the space-charge region gradually fills the film working portion, with the result that the size of the neutrality region H(U) and an effective area of the plates of the voltage-controlled capacitor formed between the conductor strips 3 and the metal layer 2 decrease incessantly. To rule out an undesirable effect of the capacitive coupling between the regions 2 and the region p+, the p-n junction (Schottky barrier) is established over a small portion of the strips 3. The required capacitance-vs-voltage relationship can be provided by appropriately selecting the shape of the working portion F(x), said relationship being found from the following equation $$C(U) = C_{\min} + \varepsilon_s/D \cdot \int_0^{H(U)} F(x) dx,$$

where the value of $C_{min}$ depends on the size of the ohmic contact with the n-type film.

Figure 12:
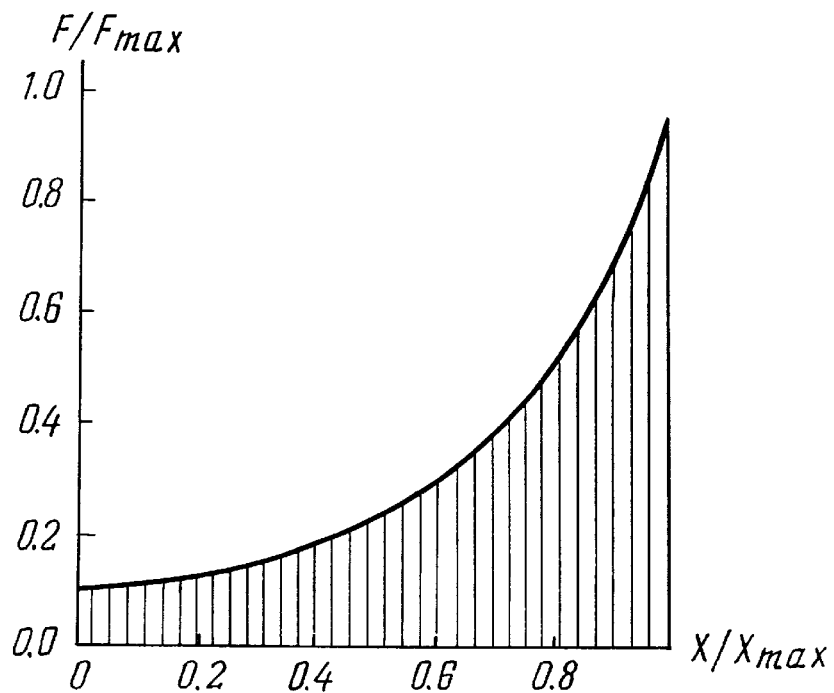
FIG. 12 presents a graphic representation of a design-basis form of a variable capacitor used in an ideal frequency modulator.

FIG. 12 presents a design-basis shape of the working portion of the voltage-controlled capacitor which can be used in an LC circuit as an ideal frequency modulator ($C(U)=C_1/(C_2=U)^2$) with the Cmax/Cmin ratio equal to 5 and the degree of doping of the n-region (H(U)~Xmax(1-U/Umax)) linearly decreasing along the direction X.

It should also be noticed that with the regions 2 and 6 immediately interconnected the semiconductor device used as a voltage-controlled capacitor may also be used as a varicap.

Exemplary Embodiments of the Invention

Figure 13:
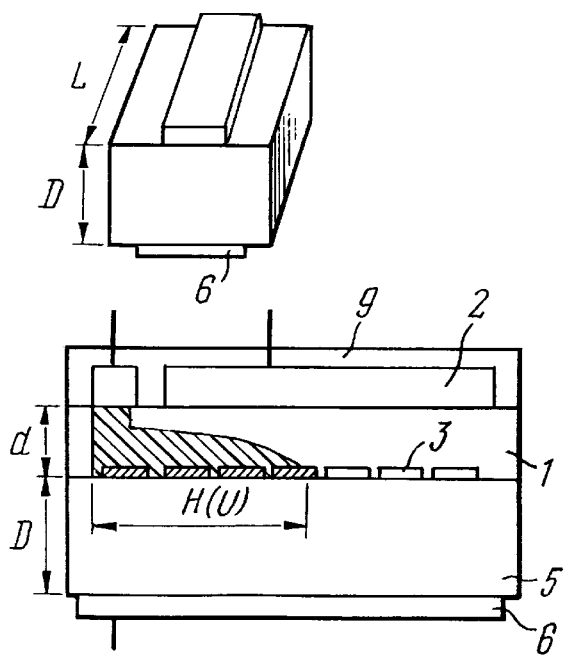
FIG. 13 presents the construction of a finished voltage-controlled capacitor.

A 50-mm long stripline is established on a 0.5-mm thick silicon dioxide substrate, having the top strip 4 mm wide and the bottom strip, 16 mm wide (FIG. 13). A number of holes 4 um wide is provided in the top strip made of an Au-Sb alloy, said holes being etched lengthwise said stripline with a 40-um pitch. A polysilicon layer 0.6 um thick is established at the start and end of the stripline over said etched holes, said layer featuring a donor impurity concentration of about 1015 1/cm³. A modulation-doped impurity profile is formed in said layer, using ion implantation of phosphorus with a 200 keV energy, so that the ion-implantation dosage varies linearly across the stripline width (i.e., lengthwise the direction X) from 1·1012 to 2.5·1011 ion/cm². A Schottky barrier is formed over the polysilicon layer by depositing an aluminium metallization layer. An ohmic contact with the polysilicon layer is made of aluminium as well by depositing said metal on a preformed heavily doped section of said layer. Once wire leads have been made, the surface of the device is coated with a protective silicon dioxide layer 9.

The characteristic impedance (Zc) of the stripline is found using the formulas (cf. "Computer-aided design of microwave-frequency devices" by K.Gupta, R.Garge, and R.Chadha, Moscow, Radio i Sviaz Publishers, 1987, pp.41–42 (in Russian), with W=H(U):

Zc=C/($2\pi\varepsilon^{1/2}$) ln (8 D/W+0.25 W/D) if W/D$\leq$1;

Zc=C/$\varepsilon^{1/2}$[W/D+1.393+0.667 ln (W/D+1.444)]$^{-1}$ if W/D>1;

$\varepsilon$=($\varepsilon_1$+1)/2+($\varepsilon_1$-1)/2[(1+10D/W)$^{-\frac{1}{2}}$].

The value of H(U) is selected such that the 0.6 um thick semiconductor polysilicon layer with a modulation-doped profile Ni(x,y) in the majority charge carriers at the section H(U),z with a minimum blocking voltage across the Schottky barrier as follows:

$$q/\varepsilon_s \cdot \int_0^d Ni(H(U), z) z \, dz = Uk + U,$$

where z—the coordinate counted off the film surface depthwise, whereon the Schottky barrier is formed;

q—an elementary charge;

$\varepsilon_s$—permittivity of the semiconductor;

Uk—built-in junction potential.

$\varepsilon_1$—permittivity of silicon dioxide, C=120$\pi$ Ohm. When operating in the radio-frequency range, the present stripline appears as a conventional voltage-controlled capacitor.

Figure 14:
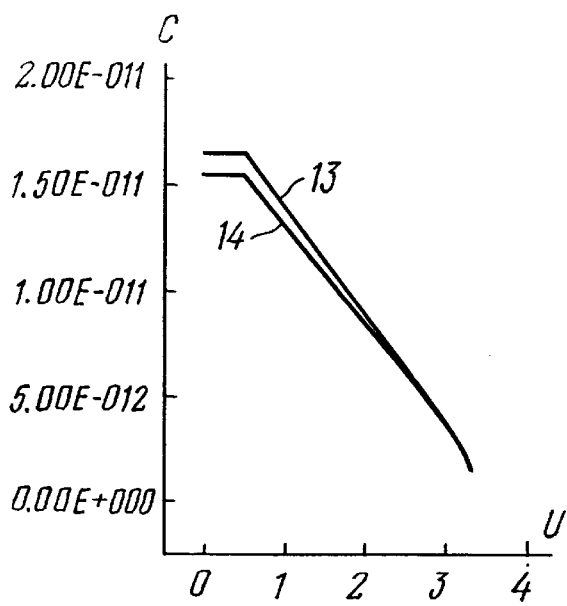
FIG. 14 is a graphic representation of a relationship between the capacitance of the proposed device and the control voltage.
Figure 15:
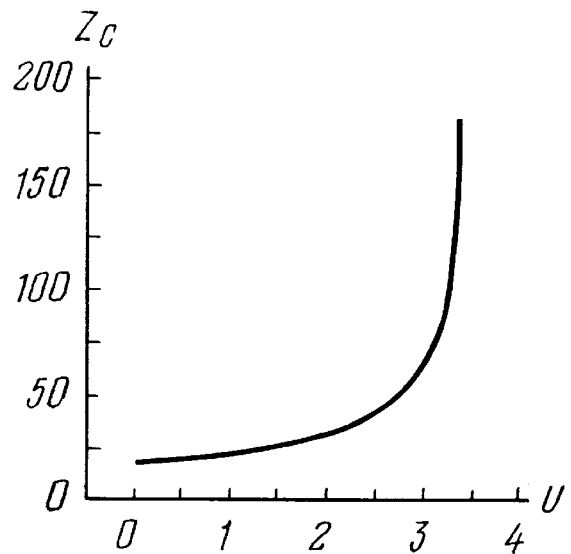
FIG. 15 is a graphic representation of a relationship between a design-basis transmission-line characteristic impedance and voltage.
Figure 16:
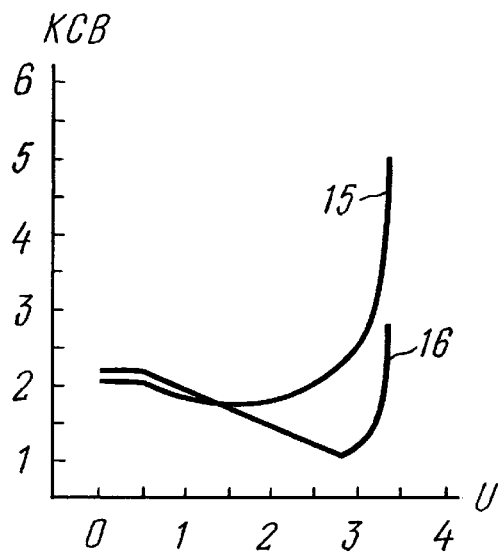
FIG. 16 is a graphic representation of a relationship between a design-basis and an experimental transmission-line standing-wave ratios and voltage.

The calculated and experimental (at a 500 kHz frequency) C(u) relationship is presented in FIG. 14. The following formula is used for the above calculation: C(U)=L/ZcCv), where Cv states for the velocity of light in silicon dioxide. The design-basis Zc(U) relationship is represented in FIG. 15. The measured relationship of the standing wave ratio SWR in a standing-wave meter having a characteristic impedance of 50 Ohm is shown in FIG. 16, one end of said meter being connected to an input signal source having a frequency of 3.2 GHz and an internal resistance of 50 Ohm, while the other end thereof is connected to a stripline loaded with a 50-Ohm load. The measured relationship is found to be equal to the calculated one, provided that loss in the stripline equals zero.

Figure 17:
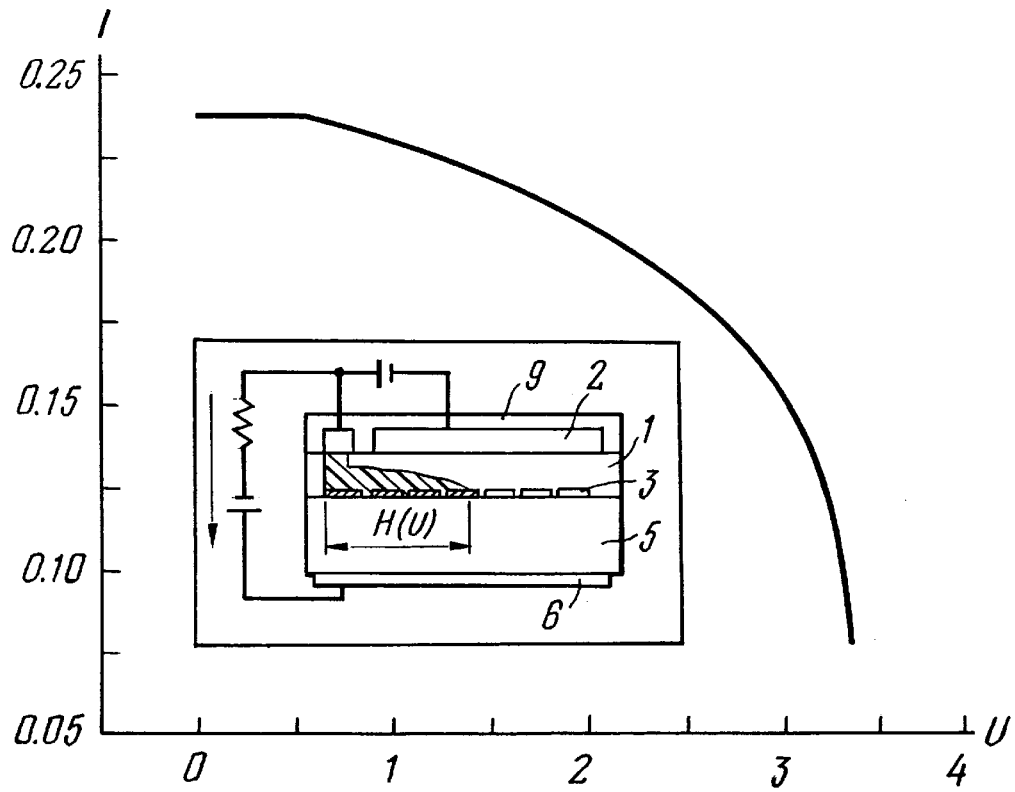
FIG. 17 a graphic representation of a measured relationship between the transistor current in the power supply circuit and the control voltage value.

Conductor strips 3 (4) made of an Au-Sb alloy are formed on a 4×1 mm rectangular area of a 0.4 mm thick substrate (FIG. 7) made of weakly doped n-type silicon having a resistivity of 12.5 Ohm, said strips being arranged across the width of said rectangle. The width of a strip is 10 um and a gap between the strips is 5 um. A polysilicon layer 0.6 um thick is established over said rectangular area, having donor impurity concentration of about 1015 1/cm3. A modulation-doped impurity profile is formed in said layer, using ion implantation of phosphorus with a 200 keV energy, so that the ion-implantation dosage varies linearly within a 4-mm length of the device (i.e., along the direction X) from 1·10$^{12}$ to 2.5·10$^{11}$ ion/cm². A Schottky barrier is formed over the polysilicon layer by depositing an aluminium metallization layer. An ohmic contact with the polysilicon layer is made also of aluminium by depositing said metal on a heavily doped section of said layer preformed along the perimeter of said rectangular area. Another contact 6 with the substrate made of an Au-Sb alloy is formed on the substrate lower surface. Once wire leads have been made, the surface of the device (FIG. 7) is coated with a protective silicon dioxide layer 9. The control voltage source 7 is connected between the Schottky barrier and the ohmic contact with polysilicon. The source 12 of a 10-volt supply voltage is connected, through the load of a 33-Ohm rating is connected between the contact 6 and the ohmic contact with polysilicon. The measured relationship between the current in the supply source circuit and the control voltage value is presented in FIG. 17.

The invention is instrumental in the provision of inertia-less variable capacitors, varicaps, transistors, and controllable transmission lines.

Industrial Applicability

The invention can find application in the electronic industry.

We claim:

1. A semiconductor device, comprising:
   an insulating layer, a first surface and a second surface arranged oppositely to each other, and a free surface of said insulating layer;
   a conductor area established on said first surface of said insulating layer;
   a first semiconductor layer featuring a first conductivity type and established on said second surface of said insulating layer, said semiconductor layer having an exterior surface, a dopant profile, a thickness, a permittivity, and x and z coordinates on said exterior surface thereof;
   a second semiconductor layer featuring a second conductivity type opposite said first conductivity type of said first semiconductor layer, said second semiconductor layer being established on said exterior surface of said first semiconductor layer and having a second ohmic contact;
   a p-n junction having a built-in junction potential formed by said first and second semiconductor layers, a metallurgical boundary of said p-n junction, and the y coordinate counted off along the thickness of said first semiconductor layer;
   said first semiconductor layer, wherein said dopant profile and thickness are so selected as to meet the condition of depletion of said first semiconductor layer or part thereof in the majority charge carriers till the breakdown of said p-n junction upon applying an external bias voltage thereto:

$$(q/\varepsilon_S) \cdot \int_0^{d(x,z)} Ni(x, y, z) y \, dy - Uk < Ui,$$

where Ui—the breakdown voltage of said first semiconductor layer;
   q—an elementary charge;
   N (x,y,z)—said dopant profile;
   d(x,z)—said thickness;
   $\varepsilon_s$—said permittivity;
   Uk—said built-in junction potential.

2. A semiconductor device as set forth in claim 1, further comprising:
   said p-n junction having a modulation-doped profile and formed along the direction X preselected on said exterior surface of said first semiconductor layer;
   a plurality of conductor strips formed along the direction Z preselected on said exterior surface of said first semiconductor layer; and,
   a first ohmic contact formed by said plurality of conductor strips and said first semiconductor layer.

3. A semiconductor device as set forth in claim 2, wherein said plurality of conductor strips is arranged in a spaced relation to said first ohmic contact.

4. A semiconductor device as set forth in claim 2, wherein said plurality of conductor strips is established on said free surface of said insulating layer.

5. A semiconductor device as set forth in claim 2, wherein said insulating layer is formed over said plurality of conductor strips.

6. A semiconductor device as set forth in claim 1, further comprising a dielectric or a high-ohmic semiconductor layer.

7. A semiconductor device as set forth in claim 1, wherein said plurality of conductor strips is connected to said first ohmic contact.

8. A semiconductor device as set forth in claim 1, wherein a plurality of conductor areas is established on said free surface of said insulating layer.

9. A semiconductor device as set forth in claim 1, wherein said insulating layer is established over a plurality of conductor strips.

10. A semiconductor device, comprising:
    an insulating layer, a first surface and a second surface arranged oppositely to each other, and a free surface of said insulating layer;
    a conductor area established on said first surface of said insulating layer;
    a first semiconductor layer featuring a first conductivity type and established on said second surface of said insulating layer, said semiconductor layer having an exterior surface, a dopant profile, a thickness, a permittivity, and the x and z coordinates on said exterior surface thereof;
    a metal layer established on said exterior surface of said first semiconductor layer and having a second ohmic contact;
    a Schottky barrier having a built-in junction potential formed by said first semiconductor layer and said metal later, a metallurgical boundary of said Schottky barrier, and the y coordinate counted off along the thickness of said first semiconductor layer;
    said first semiconductor layer, wherein said dopant profile and thickness are so selected as to meet the condition of depletion of said first semiconductor layer or part thereof in the majority charge carriers till the breakdown of said p-n junction upon applying external bias voltage thereto:

$$(q/\varepsilon_S) \cdot \int_0^{d(x,z)} Ni(x, y, z) y \, dy - Uk < Ui,$$

where Ui—the breakdown voltage of said first semiconductor layer;
    q—an elementary charge;
    N (x,y,z)—said dopant profile;
    d(x,z)—said thickness;
    $\varepsilon_s$—said permittivity;
    Uk—said built-in junction potential.

11. A semiconductor device as set forth in claim 10, further comprising:
    said Schottky barrier having a modulation-doped profile and formed along the direction X preselected on said exterior surface of said first semiconductor layer;
    a plurality of conductor strips formed along the direction Z preselected on said exterior surfaces of said first semiconductor layer; and, an ohmic contact formed by said plurality of conductor strips and said first semiconductor layer.

12. A semiconductor device as set forth in claim 10, further comprising:

said p-n junction and Schottky barrier having a modulation-doped profile and formed along the direction X preselected on said exterior surface of said first semiconductor layer;

a plurality of conductor strips formed along the direction Z preselected on said exterior surface of said first semiconductor layer; and, an ohmic contact formed by said plurality of conductor strips and said first semiconductor layer.

13. A semiconductor device, comprising:

an insulating layer, a first surface and a second surface arranged oppositely to each other, and a free surface of said insulating layer;

a conductor area established on said first surface of said insulating layer;

a first semiconductor layer featuring a first conductivity type and established on said second surface of said dielectric layer, said semiconductor layer having an exterior surface, a first and a second portion of said exterior surface, a first ohmic contact, a dopant profile, a permittivity, and the x and z coordinates on said exterior surface thereof;

a metal layer established on said first portion of said exterior surface of said first semiconductor layer and having a second ohmic contact;

a Schottky barrier having a first built-in junction potential formed by said first semiconductor layer and said metal layer, a metallurgical boundary of said Schottky barrier, and the y coordinate counted off along the thickness of said first semiconductor layer;

a second semiconductor layer featuring a second conductivity type opposite said first type on said first semiconductor layer, said second semiconductor later being established on said second portion of said exterior surface of said first semiconductor layer and having a second ohmic contact;

a p-n junction having a second built-in junction potential established by said first and second semiconductor layers, a metallurgical boundary of said p-n junction, and the y coordinate counted off along the thickness of said first semiconductor layer;

said first semiconductor layer, wherein said dopant profile and thickness are so selected as to meet the condition of depletion of said first semiconductor layer or part thereof in the majority charge carriers till the breakdown of said p-n junction or said Schottky barrier upon applying an external bias voltage thereto:

$$(q/\varepsilon_S) \cdot \int_0^{d(x,z)} Ni(x, y, z) dy - Uk < Ui,$$

where Ui—the breakdown voltage of said semiconductor layer;

q—an elementary charge;

N(x,y,z)—said dopant profile;

d(x,z)—said thickness;

$\epsilon_s$—said permittivity;

Uk—said built-in junction potentials.

14. A semiconductor device, comprising:

a low-conductivity layer, a first surface, a second surface and a free surface of said low-conductivity layer;

a conductor area established on said first surface of said low-conductivity layer;

a first semiconductor layer having a first conductivity type and established on said second surface of said low-conductivity layer, said semiconductor layer having an exterior surface, a first ohmic contact, a dopant profile, a thickness, a permittivity, and the x and z coordinates on said exterior surface thereof;

a second semiconductor layer having a second conductivity type opposite said first type of said first semiconductor layer, said second semiconductor layer being established on said second portion of said exterior surface of said first semiconductor layer and having a second ohmic contact;

a p-n junction having a built-in junction potential established by said first and second semiconductor layers, a metallurgical boundary of said p-n junction, and the y coordinate counted off along the thickness of said first semiconductor layer;

said first semiconductor layer, wherein said dopant profile and thickness are so selected as to deplete the majority charge carriers in at least part of said first semiconductor layer until the breakdown of said p-n junction or said Schottky barrier upon applying an external bias voltage thereto:

$$q/\varepsilon_s \int_0^{d(x,z)} Ni(x, y, z) dy - Uk < Ui,$$

where Ui—the breakdown voltage of said first semiconductor layer;

q—an elementary charge;

Ni(x,y,z)—said dopant profile;

d(x,z)—said thickness;

$\epsilon_s$—said permittivity;

Uk—said built-in junction potential.

15. A semiconductor device, comprising:

a low-conductivity layer, a first surface, a second surface and a free surface of said low-conductivity layer;

a conductor area established on said first surface of said low-conductivity layer;

a first semiconductor layer featuring a first conductivity type and established on said second surface of said low-conductivity layer, said semiconductor layer having an exterior surface, a first ohmic contact, a dopant profile, a thickness, a permittivity, and the x and z coordinates on said exterior surface thereof;

a metal established on said exterior surface of said first semiconductor layer and having a second ohmic contact;

a Schottky barrier having a built-in junction potential formed by said first semiconductor layer and said metal layer, a metallurgical boundary of said Schottky barrier, and the y coordinate counted off along the thickness of said first semiconductor layer;

said first semiconductor layer, wherein said dopant profile and thickness are so selected as to deplete the majority charge carriers in at least a part of said first semiconductor layer until the breakdown of said p-n junction or said Schottky barrier upon applying an external bias voltage thereto:

$$q/\varepsilon_S \cdot \int_0^{d(x,z)} Ni(x, y, z) y \, dy - Uk < Ui,$$

where Ui—the breakdown voltage of said first semiconductor layer;
q—an elementary charge;
Ni (x,y,z)—said dopant profile;
d (x,z)—said thickness;
$\varepsilon_s$—said permittivity;
Uk—said built-in junction potential.

16. A semiconductor device, comprising:
a low-conductivity layer, a first surface a second surface and a free surface of said low-conductivity layer;
a conductor area established on said first surface of said low-conductivity layer;
a first semiconductor layer featuring a first conductivity type and established on said second surface of said low-conductivity layer, said semiconductor layer having an exterior surface, a first and a second portions of said exterior surface, a first ohmic contact, a dopant profile, a thickness, a permittivity, and the x and z coordinates on said exterior surface thereof;
a metal layer established on said first portion of said exterior surface of said first semiconductor layer and having a second ohmic contact;
a Schottky barrier having a first built-in junction potential formed by said first semiconductor layer and said metal layer, a metallurgical boundary of said Schottky barrier, and the y coordinate counted off along the thickness of said first semiconductor layer;
a second semiconductor layer featuring a second conductivity type opposite said first type of said first semiconductor layer, said second semiconductor layer being established on said second portion of said exterior surface of said first semiconductor layer and having a second ohmic contact;
a p-n junction having a second built-in junction potential established by said first and second semiconductor layers, a metallurgical boundary of said p-n junction, and the y coordinate counted off along the thickness of said first semiconductor layer;
said first semiconductor layer, wherein said dopant profile and thickness are so selected as to deplete the majority charge carriers in at least a part of said first semiconductor layer until the breakdown of said p-n junction or said Schottky barrier upon applying an external bias voltage thereto:

$$q/\varepsilon_s \int_0^{d(x,z)} Ni(x, y, z) y \, dy - Uk < Ui,$$

where Ui—the breakdown voltage of said first semiconductor layer;
q—an elementary charge;
Ni(x,y,z)—said dopant profile;
d(x,z)—said thickness;
$\varepsilon_s$—said permittivity;
Uk—said built-in junction potential.

17. A semiconductor device as set forth in claim 16, further comprising:
said p-n junction barrier having a modulation-doped profile and formed along the direction X preselected on said exterior surface of said first semiconductor layer;
a plurality of conductor strips formed along the direction Z preselected on said exterior surface of said first semiconductor layer; and,
a first ohmic contact formed by said plurality of conductor strips and said first semiconductor layer.

18. A semiconductor device as set forth in claim 16, comprising:
a Schottky barrier/p-n junction having a modulation-doped profile and formed along the direction X preselected on said exterior surface of said first semiconductor layer;
a plurality of conductor strips formed along the direction Z preselected on said exterior surface of said first semiconductor layer; and,
a first ohmic contact formed by said plurality of conductor strips and said first semiconductor layer.

19. A semiconductor device as set forth in claim 16, comprising:
said p-n junction and Schottky barrier having a modulation-doped profile and formed along the direction X preselected on said exterior surface of said first semiconductor layer;
a plurality of conductor strips formed along the direction Z preselected on said exterior surface of said first semiconductor layer; and,
a first ohmic contact formed by said plurality of conductor strips and a first semiconductor layer.

20. A semiconductor device as set forth in claim 16, wherein said plurality of conductor strips is connected to said first ohmic contact.

21. A semiconductor devices as set forth in claim 16, wherein said plurality of conductor strips is arranged in a spaced relation to said first ohmic contact.

22. A semiconductor device is set forth in claim 16, wherein a plurality of conductor areas is further connected to a plurality of conductor strips.

23. A semiconductor device as set forth in claim 16, wherein said low-conductivity layer is established over a plurality of conductor strips.

* * * * *